US006756559B2

United States Patent
Seo

(12) 
(10) Patent No.: US 6,756,559 B2
(45) Date of Patent: Jun. 29, 2004

(54) PLASMA ETCHING APPARATUS

(75) Inventor: Poong-Boo Seo, Gyeongsangbuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 40 days.

(21) Appl. No.: 10/028,301

(22) Filed: Dec. 28, 2001

(65) Prior Publication Data

US 2002/0121505 A1 Sep. 5, 2002

(30) Foreign Application Priority Data

Dec. 28, 2000 (KR) ........................................ 2000-83768

(51) Int. Cl.[7] .............................................. B23K 10/00

(52) U.S. Cl. ............................. 219/121.4; 219/121.52; 219/121.51; 219/121.43; 156/345.47

(58) Field of Search ......................... 219/121.4, 121.43, 219/121.51, 121.52; 156/345.28, 345.29, 345.47; 438/726; 118/731 I, 723 E

(56) References Cited

U.S. PATENT DOCUMENTS

| | | | | |
|---|---|---|---|---|
| 5,102,523 A | * | 4/1992 | Beisswenger et al. | . 204/298.33 |
| 5,919,332 A | * | 7/1999 | Koshiishi et al. | ...... 156/345.47 |
| 6,287,980 B1 | * | 9/2001 | Hanazaki et al. | ........... 438/726 |
| 6,576,860 B2 | * | 6/2003 | Koshimizu et al. | .... 219/121.43 |

* cited by examiner

Primary Examiner—Quang T. Van
(74) Attorney, Agent, or Firm—McKenna Long & Aldridge LLP

(57) ABSTRACT

The apparatus for etching a thin film using the plasma includes a reaction chamber having a diffusion area and a reaction area; an upper electrode disposed in the top of the reaction area; a lower electrode spaced apart from the upper electrode and arranged at the bottom of the reaction area; a RF power supply applying RF power to the upper and lower electrodes so as to form the plasmas between the upper and lower electrodes; a gas inlet applying processing gases to the diffusion area; gas-exhausting members sucking the residual plasmas and byproducts of the plasma etch; a buffer plate surrounding the lower electrode at the bottom of the reaction chamber and having a plurality of vent holes and vent hole protectors; and a shielding member between the lower electrode and the buffer plate, the shielding plate protecting the lower electrode from the plasmas.

26 Claims, 3 Drawing Sheets

PLASMA ETCHING APPARATUS

This application claims the benefit of Korean Patent Application No. 2000-83768, filed on Dec. 28, 2000 in Korea, which is hereby incorporated by reference as if fully set forth herein.

BACKGROUND OF THE INVENTION

1. Field of the Invention

The present invention relates to a plasma processing apparatus, and more particularly to a plasma etching apparatus which dry-etches thin films or layers formed on a substrate for a liquid crystal display.

2. Discussion of Related Art

Plasma is an electrically neutral, highly organized gas composed of ions, electrons and neutral particles. The plasma is a phase of matter distinct from solids, liquids, and normal gases. Because plasmas are conductive and respond to electric and magnetic fields and can be efficient sources of radiation, they are usable in numerous applications where such control is needed or when special sources of energy or radiation are required. In recent years, such plasmas are introduced in the areas of plasma technology, such as thin film deposition, display systems (e.g., Plasma Display Panel (PDP)), bulk materials work, plasma-based lighting systems, environmental and health applications and materials synthesis. Among the various areas of plasma technology, plasmas are especially adopted in the field of manufacturing semiconductor devices and liquid crystal display devices, which need large-scale integrated circuits.

A plasma etching apparatus generally etches polymer and metal layers using plasmas generated by the glow discharge at a low temperature, thereby forming the large-scale integrated devices. The plasma etching apparatus widely includes a reaction chamber, a gas feeding member and a voltage supply. The reaction chamber is a sealed container containing processing gases and the gas feeding member introduces reaction gases into the reaction chamber. The voltage supply is connected to electrodes inside the reaction chamber and applies a radio frequency (RF) power to generate plasmas in the reaction chamber. The processing gases from the gas feeding member are converted into the plasmas in the reaction chamber by the electrodes.

FIG. 1 is a schematic sectional view of a conventional plasma etching apparatus. As shown in FIG. 1, the conventional plasma etching apparatus 1 includes a reaction chamber 1a, a radio frequency (RF) power supply 17 and gas-exhaust members 22 and 24. The reaction chamber 1 widely includes a gas inlet 6 through which processing gases are introduced, a plasma diffusing area 2 where the processing gases diffuse, and a reaction area 4 where plasmas are generated from the processing gases and etch an object 14. A diffusion plate 8 having a plurality of holes or slits therein is located inside the plasma diffusing area 2. The diffusion plate 8 diffuses the processing gases introduced from the gas inlet 6, whereby the processing gases are easily spread into the reaction area 4. An upper electrode 10 formed of a metallic material is disposed between the plasma diffusing area 2 and the reaction area 4, and acts as a first electrode to generate an electric field when creating the plasmas. An insulator 12 is adjacent to the upper electrode 10. The upper electrode 10 and the insulator 12 generally have a great number of holes (about ten thousands of holes) therein in order to freely ventilate the processing gases.

Still referring to FIG. 1, an object 14, such as a glass substrate or a semiconductor wafer, is located in the reaction area 4. A lower electrode 18 receiving the RF power from the RF power supply 17 is arranged at the bottom of the reaction area 4. The lower electrode 18 serves as a second electrode when forming the plasmas using the processing gases. In the reaction area 4, the object 14 (e.g., the substrate or semiconductor wafer) is etched by the plasmas generated by the upper and lower electrodes 10 and 18.

The lower electrode 18 is preferably made of a metallic material coated with aluminum, and the object 14 is disposed on the aluminum-coated lower electrode 18. A buffer plate 20 having a plurality of vent holes surrounds the lower electrode 18 at the bottom of the reaction area 4. A shielding member 16 made of a ceramic material is disposed between the lower electrode 18 and the buffer plate 20, and surrounds the lower electrode 18 in order to prevent the lower electrode 18 from being exposed. Accordingly, the buffer plate 20, shielding member 16 and lower electrode 18 are located on the same plane at the bottom of the reaction area 4. Further, the object 14 is mounted on an exposed portion of the lower electrode 18. At the bottom of the reaction chamber 1a, the gas-exhausting members 22 and 24, such as vacuum pumps, are disposed in order to remove the gaseous byproducts from the reaction area 4.

The plasma etch processes performed in the above-mentioned plasma etching apparatus 1 will be explained hereinafter. The object 4 having the polymer or metal layer for plasma etching is loaded on the exposed portion of the lower electrode 18. At this time, the object 4 has substantially the same size as the exposed portion of the lower electrode 18. Thereafter, the processing gases flow into the plasma diffusing area 2 through the gas inlet 6, and then the processing gases are diffused by the diffusion plate 8. The diffused processing gases are then spread into the reaction area 4 through the plurality of holes of the upper electrode 10 and insulator 12.

Thereafter, the RF power supply 17 applies the RF power to the lower electrode 18, such that an electric field is induced between the upper electrode 10 and the lower electrode 18. Therefore, the processing gases in the reaction area 4 are ionized to be the plasmas. The plasmas (e.g., the anions and cations) move toward the lower electrode with a high kinetic energy. The plasmas generated in the reaction area 4 allow for the ability to provide an anisotropic etch which is believed to depend on the bombardment with energetic ions on the surface of the object 14. When etching the object 14, the byproducts from the plasma etching are sucked through a plurality of holes through the buffer plate 20 by the gas-exhausting members 22 and 24, which are below the reaction chamber 1a. Accordingly, the layers on the object 14 are patterned by the above-mentioned plasma etching processes.

FIG. 2 is a top plan view of the buffer plate 20 surrounding the shielding member 16 and lower electrode 18. As shown in FIG. 2, the buffer plate 20 includes a plurality of holes 21 therein though which the gaseous byproducts and the residual plasma etchant are removed. Further in FIG. 2, the gas-exhausting members 22 and 24 (e.g., the vacuum pumps) sucking the gaseous byproducts and the residual plasma etchant are located below the reaction chamber 1a of FIG. 1 in areas corresponding to areas "A" of FIG. 2. When the gas-exhausting members 22 and 24 are operated, the gaseous byproducts and the residual plasma etchant are sucked by these gas-exhausting members 22 and 24 through the plurality of vent holes 21. However, since the gas-exhausting members 22 and 24 are located in the areas "A", the gaseous byproducts and the residual plasma etchant converge in these areas "A".

In other words, when exhausting the gaseous byproducts and the residual etchant through the plurality of vent holes 21 of the buffer plate 20, suction power is relatively larger in the areas "A" than the other area of the buffer plate 20 because the gas-exhausting members 22 and 24 are arranged under the areas "A". Therefore, the density of the byproducts and etchant increases in the areas "A", and then a convergence of the byproducts and etchant occurs in the areas "A". Thus, the convergence of the gaseous byproducts and residual plasma etchant brings about the irregular etch of the object 14 (in FIG. 1) and additionally causes arcing in areas "B" of the lower electrode 18.

The arcing phenomenon occurring in the lower electrode 18 will be explained referring to FIGS. 1 and 2. In FIGS. 1 and 2, the buffer plate 20 having the plurality of vent holes 21 is located at the bottom of the reaction area 4. Additionally, the lower electrode 18 surrounded and protected by the shielding member 16 is located at the center of the buffer plate 20. The object 14 is put and fixed on the exposed portion of the lower electrode 18. However, a gap occurs and exists between the object 14 and the shielding member 16 because of the surface irregularity of the object 14 and shielding member 16. This gap is large enough for the plasmas to pass through. Accordingly, since the gaseous byproducts and residual etchant converge in the areas "A", the plasmas strongly strike the lower electrode 18 through the gap in the areas "B" of FIG. 2, thereby causing the arcing. Due to the strong and continuous strike of the plasmas, aluminum film coating the lower electrode 18 comes apart from the lower electrode and the lower electrode 18 is exposed in the areas "B" of FIG. 2. This arcing phenomenon shortens the life span of the lower electrode 18, and thus the lower electrode 18 should be exchanged after the plasma etching processes. Namely, the convergence of the gaseous byproducts and residual plasma etchant causes the arcing in the lower electrode and then shortens the electrode's life. Additionally, the convergence of the gaseous byproducts and residual plasma etchant causes the irregular etch of the object, thereby decreasing the stability of the electronic devices that have been etched by this plasma etching process.

SUMMARY OF THE INVENTION

Accordingly, the present invention is directed to a plasma etching apparatus that substantially overcomes one or more of the problems due to limitations and disadvantages of the related art.

An advantage of the present invention is to provide a plasma etching apparatus that prevents convergence of plasmas and gaseous byproducts.

Another advantage of the present invention is to provide a plasma etching apparatus that has an improved etching efficiency and conducts uniform plasma etch.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

In order to achieve the above advantages, a plasma etching apparatus includes a reaction chamber having a diffusion area and a reaction area; an upper electrode disposed in the top of the reaction area; a lower electrode spaced apart from the upper electrode and arranged at the bottom of the reaction area; a RF power supply applying RF power to the upper and lower electrodes so as to form the plasmas between the upper and lower electrodes; a gas inlet applying processing gases to the diffusion area; gas-exhausting members sucking the residual plasmas and byproducts of the plasma etch; a buffer plate surrounding the lower electrode at the bottom of the reaction chamber and having a plurality of vent holes and vent hole protectors; and a shielding member between the lower electrode and the buffer plate, the shielding plate protecting the lower electrode from the plasmas; wherein the buffer plate is divided into a first portion, a second portion and a third portion; wherein the first portion has a size defined by multiplying a length of the shielding member by a distance between the top edge of the shielding member and the top edge of the buffer plate; wherein the second portion has a size defined by multiplying a length of the shielding member by a distance between the bottom edge of the shielding member and the bottom edge of the buffer plate; wherein the plurality of vent holes are arranged in the third portion of the buffer plate; wherein the vent hole protectors are arranged in the first and second positions; and wherein the each vent hole protector corresponds to each gas-exhausting member.

In the aforementioned plasma etching apparatus, the vent hole protectors occupy about 50% space of the first and second portions of the buffer plate, respectively. The plasma etching apparatus further comprises a diffusion plate in the diffusion area, whereby the diffusion plate diffuses the processing gases that flow from the gas inlet.

The aforementioned plasma etching apparatus further comprises an insulator that is arranged adjacent to the upper electrode and has a plurality of holes to ventilate the processing gases. The upper electrode also includes a plurality of holes to ventilate the processing gases. The shielding member is made of a ceramic material.

The first portion of the buffer plate has substantially the same size as the second portion of the buffer plate. Each gas-exhausting member is a vacuum pump.

The vent hole protectors are formed when forming the buffer plate. Alternatively, the vent hole protectors can be made by way of attaching additional plates upon the first and second portions of the buffer plate. Here, the additional plates are an insulating material and has a enough thickness not to affect the plasma etching process.

It is to be understood that both the foregoing description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment of the invention and together with the description serve to explain the principle of the invention.

In the drawings.

DETAILED DESCRIPTION OF ILLUSTRATED EMBODIMENTS

Reference will now be made in detail to illustrated embodiment of the present invention, examples of which are shown in the accompanying drawings. Wherever possible, similar reference numbers will be used throughout the drawings to refer to the same or like parts.

Figure 1:
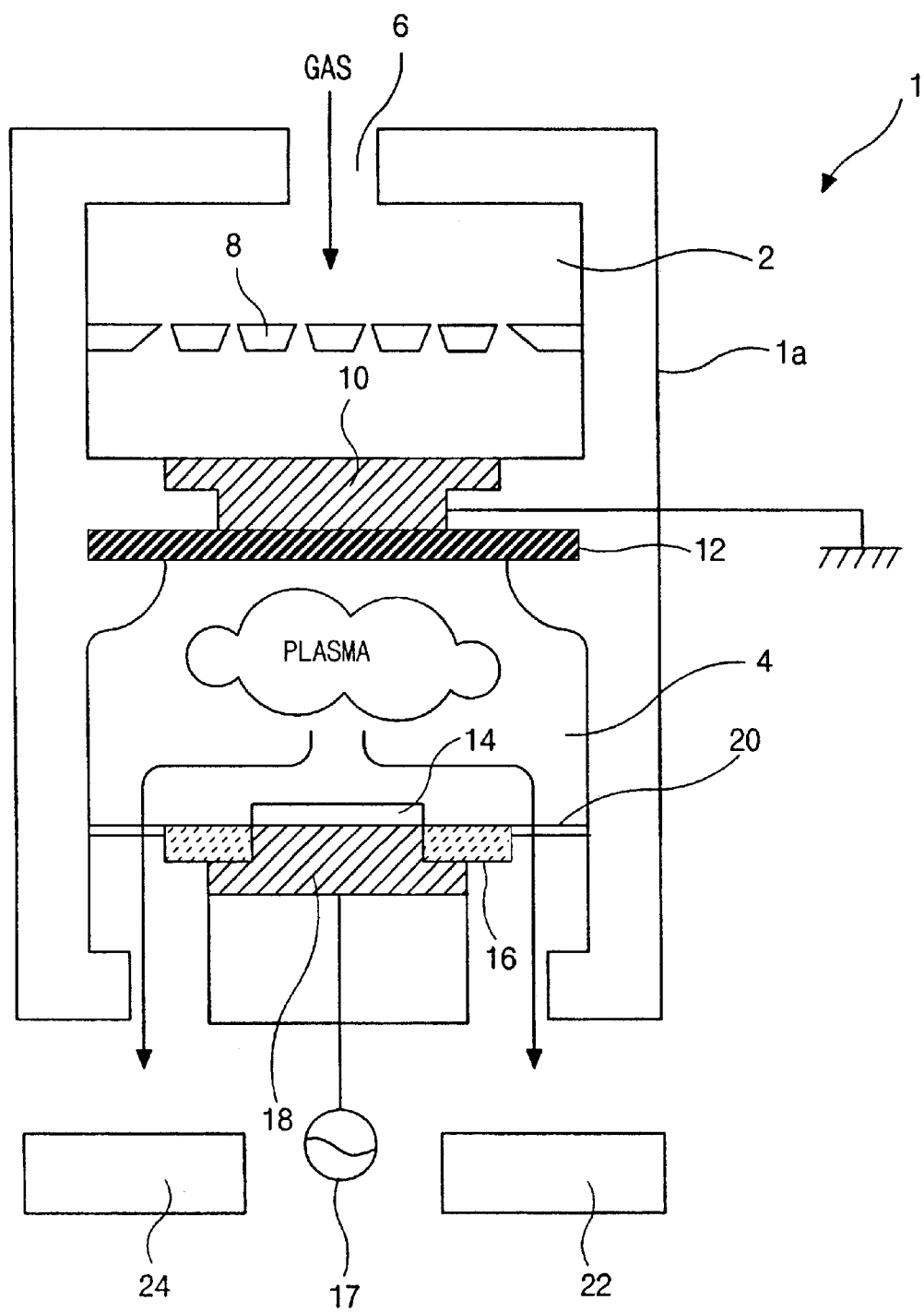
FIG. 1 is a schematic sectional view of a conventional plasma etching apparatus.

In the plasma etching apparatus according to the present invention, vent hole protectors are formed in a buffer plate, whereby a gas convergence phenomenon is prevented. The plasma etching apparatus having the vent hole protectors in the buffer plate has the same or similar configuration and structure as the apparatus shown in FIG. 1, and thus, some of the explanations are omitted.

Figure 2:
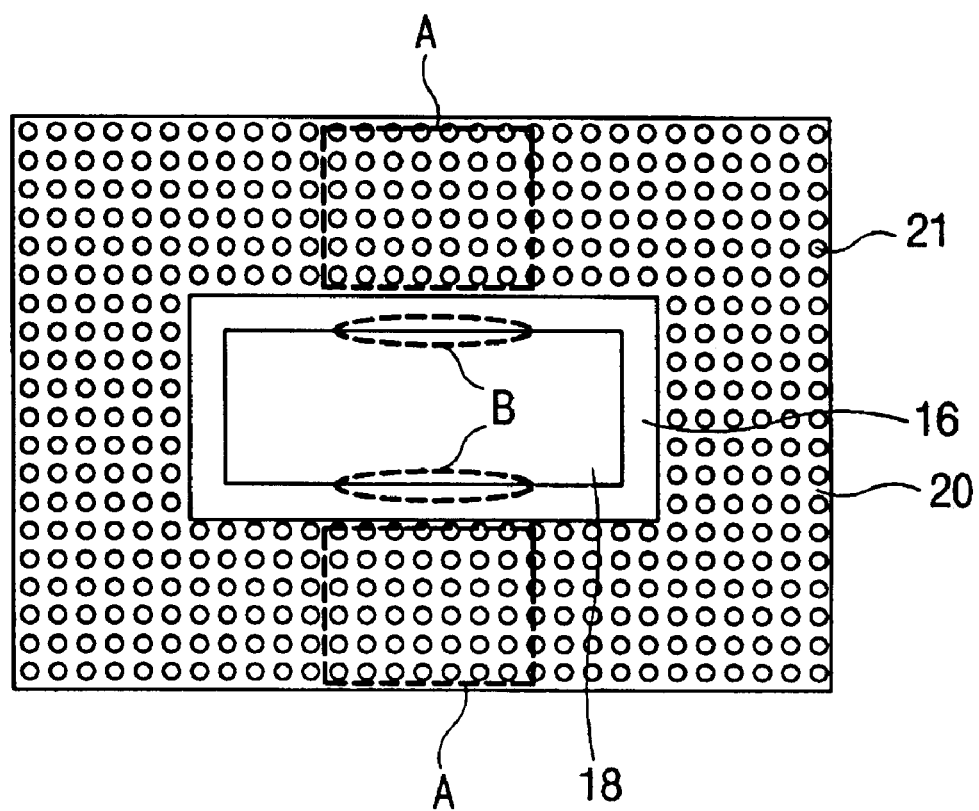
FIG. 2 is a top plan view of a buffer plate surrounding a shielding member and lower electrode of the conventional plasma etching apparatus.
Figure 3:
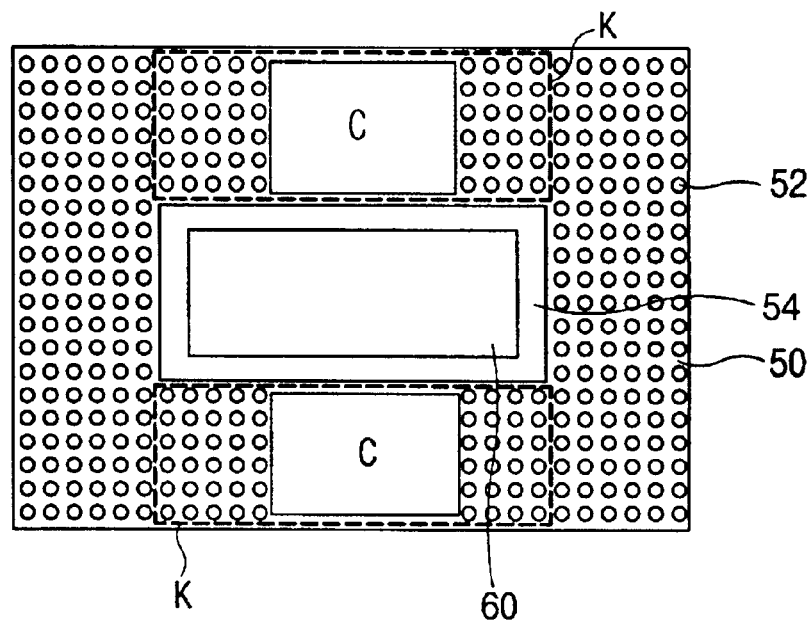
FIG. 3 is a top plan view of a buffer plate surrounding a shielding member and lower electrode according to the present invention.

FIG. 3 is a top plan view of a buffer plate surrounding a shielding member and lower electrode according to the present invention. As shown in FIG. 3, a lower electrode 60 is located at the central portion of a buffer plate 50 and a shielding member 54 surrounds the lower electrode 60 to protect the lower electrode 60. Thus, the buffer plate 52 surrounds the lower electrode 60 and shielding member 54. The buffer plate 50 of the present invention has a plurality of vent holes 52 therein except for portions "C" that corresponds to the areas "A" of FIG. 2, where the convergence of the gaseous byproducts and residual plasma etchant occurs. Namely, the buffer plate 50 of the present invention does not have any vent holes in the areas "C". The areas "C" can be referred to as vent hole protectors.

The vent hole protectors "C" can be formed by attaching additional plates on the areas "A" of FIG. 2 where the gaseous byproducts and residual plasma etchant converge in the conventional art. Alternatively, the vent hole protectors "C" can be made by not forming the vent holes 52 in the areas "A" of the buffer plate of FIG. 2 when fabricating the buffer plate 50. Between the two methods of forming the vent hole protectors "C", the later one is advisably recommended. Further when attaching the additional plates on the buffer plate 50 to make the vent hole protectors "C", it is very important that the additional plates should be an insulating material so thick as not to affect the plasma etch process.

Furthermore, the size of each vent hole protector "C" is about 50% of each dotted area "K" of FIG. 3. When the each dotted area "K" is determined by multiplying a length of the shielding member 54 by a distance between the top or bottom edge of the shielding member 54 and the top or bottom edge of the buffer plate 50, it is recommended that each vent hole protector "C" occupies approximately 50% of each dotted area "K".

If the size of the vent hole protector "C" is extended much more than about 50% of the area K, it results in too large a decrease of vent holes 52, and thus, the gaseous byproducts and residual plasma etchant are not removed sufficiently. Thus, the plasma etching is conducted non-uniformly. On the contrary, if the size of the vent hole protector "C" is lessened much less than about 50% of the area K, it results in the convergence of the gaseous byproducts and residual plasma etchant. Thus, the arcing occurs in the lower electrode 60 as described in the conventional art and the plasma etching is also conducted non-uniformly. Beneficially, the size of the vent hole protector "C" can range from 40% to 60%.

Figure 4:
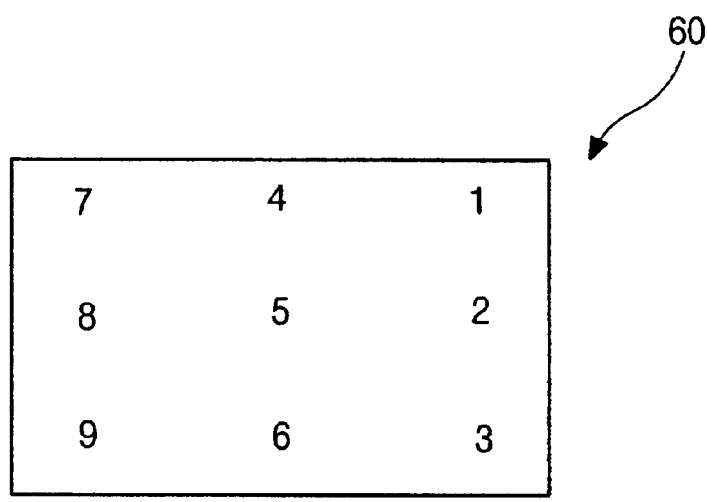
FIG. 4 is a top plan view of the lower electrode and shows points for an examination.

Table 1 shows etch depths of an amorphous silicon layer after the amorphous silicon layer is plasma-etched, as compared the present invention with the conventional art. For the experimental results shown in Table 1, the amorphous silicon layer having a thickness of 2,000 angstroms (Å) is first formed on an eighteen inch (18") substrate for use in a liquid crystal display. For the comparison between the present invention and the conventional art, the experiments were separately conducted when the vent hole protector "C" occupies 50% space of the dotted area "K" as shown in FIG. 3 and when the vent hole protector "C" is not formed in the buffer plate (i.e., 0%) as shown in FIG. 2. The etch depths shown in Table 1 are expressed in terms of angstroms (Å), and the etch depths are measured in nine points of the substrate as shown in FIG. 4. Further, the substrate having the amorphous silicon layer is exposed to the plasmas for 20 seconds, and chlorine gas ($Cl_2$) and sulfur hexafluoride ($SF_6$) gas are used as the processing gases.

TABLE 1

| Measurement Points | Ratio of the vent hole protector's size within the dotted area "K" of FIG. 3 | |
|---|---|---|
| | 0% | 50% |
| 1 | 1159 | 1064 |
| 2 | 1069 | 1020 |
| 3 | 1205 | 1045 |
| 4 | 1188 | 1065 |
| 5 | 969 | 975 |
| 6 | 1188 | 1034 |
| 7 | 1073 | 1040 |
| 8 | 986 | 1005 |
| 9 | 1100 | 1054 |
| Average | 1104 | 1033 |
| Maximum | 1205 | 1065 |
| Minimum | 969 | 975 |
| Range | 236 | 89 |
| Uniformity | 10.9% | 4.4% |

Accordingly, comparing an embodiment the present invention in which 50% of the area K has no vent holes or has covered vent holes with the conventional art (0%), the illustrated embodiment of present invention has the following advantages. Although the etch depths are not large when the vent hole protectors are formed in the buffer plate compared to when the vent hole protectors do not exist in the buffer plate, the plasma etch uniformity is improved by way of changing 10.9% to 4.4%. Furthermore, when the vent hole protectors are formed in the buffer plate, the arcing phenomenon does not occur in the lower electrode.

Table 2 shows etch depths of an amorphous silicon layer after the substrate having the amorphous silicon layer is plasma-etched. For the experimental results shown in Table 2, an amorphous silicon layer having a thickness of 2,000 angstroms (Å) is first formed on a fifteen and one-tenth inch (15.1") substrate for use in a liquid crystal display. For the comparison between the present invention and the other cases, the experiments were separately conducted when the vent hole protector "C" occupies about 50% space of the dotted area "K" as shown in FIG. 3, when the vent hole protector "C" occupies 100% space of the dotted area "K", and when the vent hole protector "C" is not formed in the buffer plate (i.e., 0%) as shown in FIG. 2. The etch depths shown in Table 2 are expressed in terms of angstroms (Å), and the etch depths are measured in nine points of the substrate as shown in FIG. 4. Further, the substrate having the amorphous silicon layer is exposed to the plasmas for 20 seconds, and chlorine gas ($Cl_2$) and sulfur hexafluoride ($SF_6$) gas are used as the processing gases.

TABLE 2

| Measurement Points | Ratio of the vent hole protector's size within the dotted area "K" of FIG. 3 | | |
|---|---|---|---|
| | 0% | 50% | 100% |
| 1 | 874 | 815 | 737 |
| 2 | 852 | 821 | 787 |
| 3 | 864 | 782 | 746 |
| 4 | 933 | 798 | 794 |
| 5 | 846 | 827 | 790 |
| 6 | 938 | 797 | 750 |
| 7 | 841 | 801 | 789 |
| 8 | 860 | 787 | 761 |
| 9 | 845 | 812 | 752 |
| Average | 873 | 804 | 767 |
| Maximum | 938 | 827 | 794 |
| Minimum | 841 | 782 | 737 |
| Range | 97 | 45 | 57 |
| Uniformity | 5.5% | 2.85% | 3.7% |

As a result of the Tables 1 and 2, it is easily noticed that the amorphous silicon layer has the uniform thickness upon the substrate. Additionally, the plasma etch uniformity is optimized when the vent hole protector occupies 40 to 60% space of the dotted area of FIG. 3. According to the present invention, since the convergence of the gaseous byproducts and residual plasma etchant is prevented, uniform plasma etching is obtained and the arcing phenomenon is also prevented in the lower electrode.

It will be apparent to those skilled in the art that various modifications and variations can be made in the capacitor and the manufacturing method thereof of the present invention without departing from the spirit or scope of the inventions. Thus, it is intended that the present invention cover the modifications and variations of this invention provided they come, within the scope of the appended claims and their equivalents.

What is claimed is:

1. A plasma etching apparatus, comprising:
    a reaction chamber having a diffusion area and a reaction area;
    an upper electrode disposed in the top of the reaction area;
    a lower electrode spaced apart from the upper electrode and arranged at the bottom of the reaction area;
    a RF power supply for applying RF power to the upper and lower electrodes so as to form the plasmas between the upper and lower electrodes;
    a gas inlet for applying processing gases to the diffusion area;
    gas-exhausting members for sucking the residual plasmas and byproducts of the plasma etch;
    a buffer plate surrounding the lower electrode at the bottom of the reaction chamber and having a plurality of vent holes and vent hole protectors; and
    a shielding member between the lower electrode and the buffer plate, the shielding member protecting the lower electrode from the plasmas;
    wherein the buffer plate is divided into a first portion, a second portion and a third portion;
    wherein the first portion has a size defined by multiplying a length of the shielding member by a distance between the top edge of the shielding member and the top edge of the buffer plate;
    wherein the second portion has a size defined by multiplying a length of the shielding member by a distance between the bottom edge of the shielding member and the bottom edge of the buffer plate;
    wherein the plurality of vent holes are arranged in the third portion of the buffer plate;
    wherein the vent hole protectors are arranged in the first and second positions; and
    wherein the each vent hole protector corresponds to each gas-exhausting member.

2. The apparatus of claim 1, wherein each vent hole protector occupies an area equal to about 50% of an area of the first portion of the buffer plate.

3. The apparatus of claim 1, wherein each vent hole protector occupies an area equal to about 50% of an area of the second portion of the buffer plate.

4. The apparatus of claim 1, further comprising a diffusion plate in the diffusion area.

5. The apparatus of claim 4, wherein the diffusion plate diffuses the processing gases that flow from the gas inlet.

6. The apparatus of claim 1, further comprising an insulator that is arranged adjacent to the upper electrode and has a plurality of holes to ventilate the processing gases.

7. The apparatus of claim 1, wherein the upper electrode includes a plurality of holes to ventilate the processing gases.

8. The apparatus of claim 1, wherein the shielding member is made of a ceramic material.

9. The apparatus of claim 1, wherein the first portion of the buffer plate has substantially the same size as the second portion of the buffer plate.

10. The apparatus of claim 1, wherein each gas-exhausting member is a vacuum pump.

11. The apparatus of claim 1, wherein the vent hole protectors are formed when forming the buffer plate.

12. The apparatus of claim 1, wherein the vent hole protectors are made by way of attaching additional plates on the first and second portions of the buffer plate.

13. The apparatus of claim 12, wherein the additional plates are an insulating material.

14. The apparatus of claim 12, wherein the additional plate has a enough thickness not to affect the plasma etching process.

15. A plasma etching apparatus, comprising:
    a reaction chamber having a diffusion area and a reaction area;
    an upper electrode disposed in the top of the reaction area;
    a lower electrode spaced apart from the upper electrode and arranged at the bottom of the reaction area;
    a power supply for applying power to the upper and lower electrodes;
    a gas inlet applying processing gases to the diffusion area;
    gas-exhausts for removing residual plasmas and byproducts from the reaction chamber;
    a buffer plate surrounding the lower electrode, the buffer plate having a vent hole region having plurality of vent holes and a non-vent hole region having no vent holes; and
    a shielding member between the lower electrode and the buffer plate, the shielding plate protecting the lower electrode,
    wherein the non-vent hole region corresponds in position to the gas-exhaust.

16. The apparatus of claim 15, wherein the non-vent hole region of the buffer plate having vent holes has an area substantially equal to an area determined by multiplying a length of the shielding member by a distance between the top edge of the shielding member and the top edge of the buffer plate and an area determined by multiplying a length of the shielding member by a distance between the bottom edge of the shielding member and the bottom edge of the buffer plate.

17. The apparatus of claim 15, further comprising a diffusion plate in the diffusion area.

18. The apparatus of claim 17, wherein the diffusion plate diffuses the processing gases that flow from the gas inlet.

19. The apparatus of claim 15, further comprising an insulator that is arranged adjacent to the upper electrode and has a plurality of holes to ventilate the processing gases.

20. The apparatus of claim 15, wherein the upper electrode includes a plurality of holes to ventilate the processing gases.

21. The apparatus of claim 15, wherein the shielding member is made of a ceramic material.

22. The apparatus of claim 15, wherein each gas-exhausting member is a vacuum pump.

23. The apparatus of claim 15, wherein the non-vent hole region is made by way of attaching additional plates on the buffer plate.

24. The apparatus of claim 23, wherein the additional plates are an insulating material.

25. The apparatus of claim 23, wherein the additional plate has a enough thickness not to affect the plasma etching process.

26. The apparatus of claim 15, wherein the non-vent hole region corresponds to a location of the gas-exhausts.

* * * * *